(12) United States Patent
Shklyarevskiy et al.

(10) Patent No.: US 11,938,726 B2
(45) Date of Patent: Mar. 26, 2024

(54) DROPLET JETTING DEVICE

(71) Applicant: CANON KABUSHIKI KAISHA, Tokyo (JP)

(72) Inventors: Igor Shklyarevskiy, Nijmegen (NL); Martijn Goedbloed, Aachen (DE); Youri De Loore, Genk (BE); Patrick Brandts, Maastricht (NL); Takahiro Peter Terayama, Eindhoven (NL); Sandor Joppen, Grubbenvorst (NL); Bram Pape, Rosmalen (NL)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 17/481,100

(22) Filed: Sep. 21, 2021

(65) Prior Publication Data
US 2022/0088923 A1  Mar. 24, 2022

(30) Foreign Application Priority Data
Sep. 23, 2020 (EP) .................................. 20197714

(51) Int. Cl.
*B41J 2/045* (2006.01)
*B81B 3/00* (2006.01)
(52) U.S. Cl.
CPC ....... *B41J 2/04581* (2013.01); *B41J 2/04578* (2013.01); *B81B 3/0086* (2013.01); *B81B 2201/032* (2013.01)
(58) Field of Classification Search
CPC ............................................. B41J 2002/14241
See application file for complete search history.

(56) References Cited

U.S. PATENT DOCUMENTS

| | | | |
|---|---|---|---|
| 2007/0263040 A1* | 11/2007 | Enomoto | B41J 2/1626 347/70 |
| 2008/0291254 A1* | 11/2008 | Kyoso | B41J 2/155 347/92 |
| 2008/0295333 A1 | 12/2008 | Wijngaards et al. | |
| 2012/0069101 A1* | 3/2012 | Kato | B41J 2/1632 347/70 |

(Continued)

FOREIGN PATENT DOCUMENTS

EP  3362289 A1  8/2018

*Primary Examiner* — Shelby L Fidler
(74) *Attorney, Agent, or Firm* — Canon U.S.A., Inc. I.P. Division

(57) ABSTRACT

A droplet jetting device comprising a membrane layer defining a pressure chamber that is in fluid communication with a nozzle, the membrane layer carrying, on a membrane that covers the pressure chamber, an actuator for generating pressure waves in a liquid in the pressure chamber, the device further comprising a distribution layer bonded to the membrane layer on the side of the membrane and defining a supply line for supplying the liquid to the pressure chamber, the supply line being connected to the pressure chamber via a restrictor passage extending through the distribution layer in the thickness direction of that layer, and via a window formed in the membrane, characterized in that the restrictor passage has a uniform cross-section, and the membrane window is delimited by a contour that is inwardly offset from the contour of the restrictor passage on the entire periphery of the restrictor passage.

9 Claims, 5 Drawing Sheets

(56) References Cited

U.S. PATENT DOCUMENTS

| | | | |
|---|---|---|---|
| 2013/0120504 A1* | 5/2013 | Yanata | B41J 2/14233 |
| | | | 347/68 |
| 2017/0100934 A1* | 4/2017 | Masuda | B41J 2/1623 |
| 2018/0290450 A1* | 10/2018 | Reinten | B41J 2/14233 |
| 2018/0345666 A1* | 12/2018 | Hayashi | B41J 2/1626 |
| 2019/0009539 A1 | 1/2019 | Nakayama et al. | |
| 2019/0036006 A1* | 1/2019 | Sugawara | H10N 30/079 |
| 2019/0077147 A1 | 3/2019 | Yazaki | |
| 2020/0290355 A1 | 9/2020 | Giusti et al. | |

\* cited by examiner

DROPLET JETTING DEVICE

CROSS REFERENCE TO RELATED APPLICATION

This application claims the benefit under 35 U.S.C. § 119(a)-(d) of European Patent Application No. 20197714.7, filed on Sep. 23, 2020. The above cited patent application is incorporated herein by reference in its entirety.

FIELD OF THE DISCLOSURE

The disclosure generally relates to a droplet jetting device for use in an inkjet printer, as well as to a method for manufacturing such a droplet jetting device. More particularly, the disclosure relates to manufacturing ink jet devices which are formed by Micro Electro-Mechanical Systems (MEMS).

BACKGROUND OF THE DISCLOSURE

In order to form the necessary functional components and structures of the jetting devices in an efficient process, it is common practice to apply a sequence of (photo-) lithographic steps and bonding steps on a wafer scale, thereby to obtain a wafer stack which can then be diced in order to obtain individual jetting devices or groups of jetting devices. In the lithographic steps, the necessary structures are gradually built up on the respective wafers, and the bonding steps are used to build up the wafer stack by stacking the wafers one upon the other and bonding them together. It will be understood that the lithographic steps and the bonding steps may be performed in an alternating sequence, so that some of the lithographic steps may be performed not on individual wafers but on complete or incomplete wafer stacks.

In order to perform these process steps safely and without damaging the fragile structures, it is necessary that each substrate or stack of substrates have a sufficient thickness and mechanical strength to be manipulated during the sequence of process steps. Further, the final stack of substrates needs to have sufficient mechanical strength and thus requires a certain minimum thickness.

An example of a droplet jetting device and a manufacturing method therefor have been described in EP 3 362 289 B1.

The distribution wafer has the purpose to form a cover that protects the actuators on the membrane wafer and/or delimits the pressure chambers. Further, the distribution wafer defines supply lines through which the liquid (e.g. ink) is supplied to the individual pressure chambers. These supply lines include so-called restrictors which are formed by passages with a carefully calibrated length and cross-section and serve to appropriately adapt the inertance of the liquid flow system such that, when a pressure wave is created in the pressure chamber, a droplet of the liquid will be jetted out through the nozzles rather than only flowing back towards the supply side through the restrictor passage.

In some of the known designs, the restrictor passage has a non-uniform cross-section and has a portion with a smaller width on the side of the supply line and a mouth with a larger width on the side of the membrane. In view of the flow dynamics of the liquid in the restrictor passage and in view of the complexity of the etching steps for forming the restrictor passage, it would be desirable to have a restrictor passage with a uniform cross-section and without any steps in its walls.

It has been found that, sometimes, the lifetime of the MEMS chips is limited due to corrosion and electrochemical reactions which affect the electrical leads that provide a drive voltage and current for the actuators and transmit signals to and from the actuators which may for example be piezoelectric actuators.

SUMMARY OF THE DISCLOSURE

Aspects of the disclosure relate to a droplet jetting device comprising a membrane layer defining a pressure chamber that is in fluid communication with a nozzle, the membrane layer carrying, on a membrane that covers the pressure chamber, an actuator for generating pressure waves in a liquid in the pressure chamber, the device further comprising a distribution layer bonded to the membrane layer on the side of the membrane and defining a supply line for supplying the liquid to the pressure chamber, the supply line being connected to the pressure chamber via a restrictor passage extending through the distribution layer in the thickness direction of that layer, and via a window formed in the membrane.

BRIEF DESCRIPTION OF THE DRAWINGS

The present disclosure will become more fully understood from the detailed description given herein below and the accompanying drawings which are given by way of illustration only, and thus are not limitative of the present disclosure, and wherein.

DETAILED DESCRIPTION OF THE PREFERRED EMBODIMENTS

Figure 1:
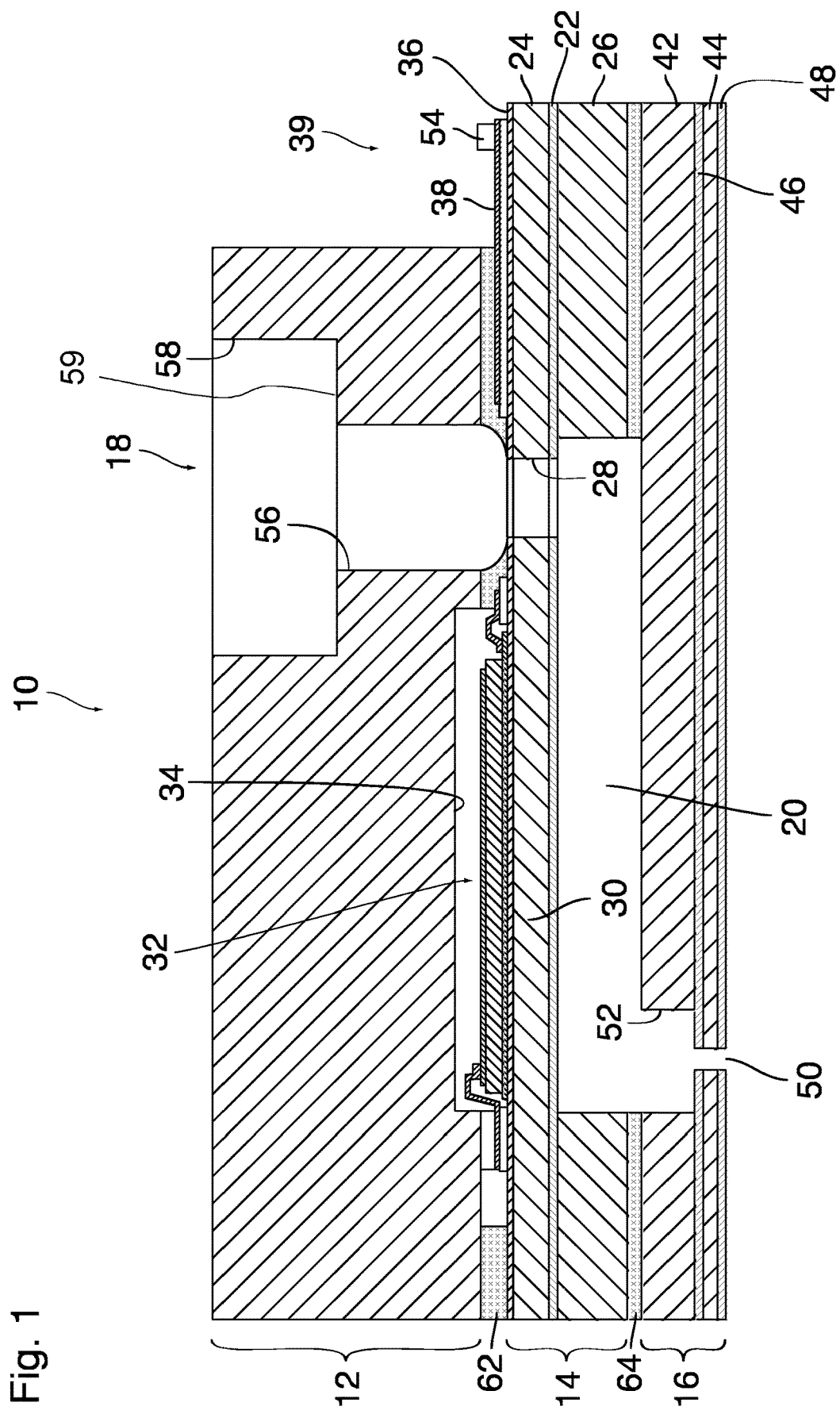
FIG. 1 is a schematic sectional view of a droplet jetting device according to an embodiment of the disclosure.

It is an object of the disclosure to reduce the failure rate of the droplet jetting devices.

According to the disclosure, in order to achieve this object, the restrictor passage has a uniform cross-section, and the membrane window is delimited by a contour that is inwardly offset from the contour of the restrictor passage on the entire periphery of the restrictor passage.

It has been found that one of the reasons for chip failure is the intrusion of liquid ink into the joint between the distribution layer and the membrane layer. When the intruded ink reaches the electrical leads that contact the actuators, leak currents may be produced which cause the harmful electrochemical reactions. Normally, the joint between the distribution layer and the membrane layer should be sealed by an adhesive that is used for bonding these layers together. However, the adhesive may undergo a certain shrinkage in the curing process, and the clefts that are caused by this shrinkage tend to be widened in a subsequent etching process, typically a DRIE (Deep Reactive Ion Etching) process by which the window is formed in the membrane.

In the device according to the disclosure, the parts of the membrane that delimit the window project inwardly beyond the periphery of the restrictor passage and thereby shield the adhesive from the attack of the ions in the etching process. As a result, the liquid ink can be prevented from reaching the electrical conductors.

The portions of the membrane that surround the window provide a substrate for placing a metal ring, e.g. formed by an Al lead on the membrane, which will additionally protect the signal electrodes from corrosion caused by the ink.

Further scope of applicability of the present disclosure will become apparent from the detailed description given hereinafter. However, it should be understood that the detailed description and specific examples, while indicating preferred embodiments of the present disclosure, are given by way of illustration only, since various changes and modifications within the spirit and scope of the present disclosure will become apparent to those skilled in the art from this detailed description.

The present disclosure will now be described with reference to the accompanying drawings, wherein the same reference numerals have been used to identify the same or similar elements throughout the several views.

FIG. 1 shows a single droplet jetting device 10 which is one of a plurality of jetting devices that have an identical design and are integrated into a common MEMS chip that may be used in an ink jet print head, for example. The MEMS chip and, accordingly, the jetting devices 10 have a layered structure comprising as main layers a distribution layer 12, a membrane layer 14 and a nozzle layer 16.

The distribution layer 12 is a single silicon layer having a relatively large thickness of at least 200 micron, preferably 300 micron and more preferably more than 400 micron. In the present example, the thickness is 400 micron. The distribution layer 12 defines an ink supply line 18 through which liquid ink may be supplied from an ink reservoir (not shown) to a pressure chamber 20 that is formed on the bottom side of the membrane layer 14.

The membrane layer 14 is obtained from an SOI wafer having an insulator layer 22 and silicon layers 24 and 26 formed on both sides thereof. In this embodiment, the final membrane layer 14 may have a thickness of about 75 micron. The pressure chamber 20 is formed in the bottom silicon layer 26. The top silicon layer 24 and the insulator layer 22 form a continuous flexible membrane 30 with uniform thickness which extends over the entire area of the MEMS chip and is pierced by a window 28 only at the position of the ink supply line 18 so as to connect the ink supply line to the pressure chamber 20. A piezoelectric actuator 32 is formed on the top side of the part of the membrane 30 that covers the pressure chamber 20. The actuator 32 is accommodated in an actuator chamber 34 formed at the bottom side of the distribution layer 12.

An electrically insulating silicon oxide layer 36 insulates the actuator 32 and its electrodes from the silicon layer 24 and carries electric leads 38 arranged to contact the electrodes on the top and bottom sides of the actuator 32. The leads 38 are exposed and contactable in a contact region 39 where the distribution layer 12 has been removed. As can better be seen in the enlarged view in FIG. 2, the leads 38 are formed on a (TEOS) primer layer 40 and are covered by a protective SiN layer 41.

The nozzle layer 16 is obtained from a double-SOI wafer and has a top silicon layer 42 and a thinner silicon layer 44 interposed between two insulator layers 46 and 48. In this embodiment, the final nozzle layer may have a thickness of about 125 micron. A nozzle 50 is formed in the two insulator layers 46 and 48 and in the silicon layer 44 intervening between them, so that the thickness of these three layers defines the length of the nozzle. The top silicon layer 42 of the nozzle layer 16 defines a feedthrough 52 which connects the pressure chamber 20 to the nozzle 50 but has a cross-section that is significantly larger than that of the nozzle 50.

It will be understood that the droplet jetting devices 10 of the MEMS chip are arranged such that their nozzles 50 define a nozzle array consisting for example of one, two or even more parallel nozzle lines with uniform nozzle-to-nozzle spacings which will determine the spatial resolution of the print head. Within the contact region 39, each of the leads 38 can be contacted, e.g. via bumps 54, so that energizing signals in the form of electric voltage pulses may be applied individually to each actuator 32. When a voltage is applied to the electrodes of the actuator 32, the piezoelectric material of the actuator is caused to deform in a bending mode, thereby flexing the membrane 30 and consequently changing the volume of the pressure chamber 20. Typically, a voltage pulse is applied to the actuator to cause a deformation that increases the volume of the pressure chamber 20, so that ink is sucked-in from the supply line 18. Then, when the voltage pulse drops off or changes into a pulse with opposite polarity, the volume of the pressure chamber 20 is decreased abruptly, so that an acoustic pressure wave is generated which propagates through the pressure chamber 20 and through the feedthrough 52 to the nozzle 50, with the result that a droplet of ink is jetted-out from the nozzle 50.

In order to obtain a stable and reproducible droplet generation and jetting behaviour, it is necessary that some critical parameters of the design of the jetting device 10 are controlled with high accuracy. This applies in particular to the length and the cross-sectional area of the nozzle 50 and to the acoustic properties and flow properties of the ink supply system.

When the actuator 32 performs a suction stroke, ink is sucked in from the ink supply line 18 whereas capillary forces in the nozzle 50 prevent ambient air from entering through the nozzle. Then, during the subsequent compression stroke of the actuator 32, the acoustic pressure that causes the ink to be jetted out from the nozzle 50 has to overcome the capillary forces in the nozzle as well as the frictional forces that are produced in the nozzle 50 and in the feedthrough 52 due to a certain viscosity of the liquid ink. The ink supply line 18 must be designed such that, in spite of these resistances, a significant part of the ink is forced out as a droplet through the nozzle 50 rather than being only pushed back into the ink supply line 18. To that end, the ink supply system is designed to have a certain inertance, so that the inertia of the liquid that flows in during the suction stroke will compensate the forces that tend to urge the liquid back in opposite direction during the compression stroke.

In order to control the inertance of the ink supply system, the ink supply line 18 is connected to the window 28 via a restrictor passage 56, i.e. a liquid flow passage with a certain length L and a certain cross-sectional area A. If ρ is the density of the liquid ink, then the inertance I is given by:

$$I = \rho L/A.$$

Consequently, the inertance could theoretically be made as large as desired by reducing the cross-sectional area A.

This, however, would also increase the frictional flow resistance due to the viscosity of the ink, so that, in practise, the cross-sectional area A cannot be reduced below a certain limit. Consequently, the restrictor passage 56 must necessarily have a certain length.

In the design that is proposed here, the relatively large thickness of the distribution layer 12 is utilized for arranging the restrictor passage 56 to extend vertically through the distribution layer 12. That is, the longitudinal axis of the restrictor passage 56 is normal to the plane of the layers 12, 14 and 16 of the device. This permits a compact design with small dimensions of the jetting device 10 in the plane of the layers 12-16. This has the advantage that a larger number of MEMS chips can be produced from a single wafer having a given diameter. Further, the compact design permits a close packing of the individual devices 10 within the chip, and therewith a high nozzle density and, consequently, a high spatial resolution of the print head. Another advantage of the vertical arrangement of the restrictor passage 56 is that the length and cross-sectional area of the restrictor passage can be controlled with high precision by using well-established lithographic techniques.

In the example shown, the restrictor passage 56 extends from a bottom 59 (or bottom wall 59) of a trench 58 towards the membrane 30 and has a uniform cross-section on its entire length. This permits to select the dimensions of the restrictor passage as needed in order to provide the required inertance.

Figure 2:
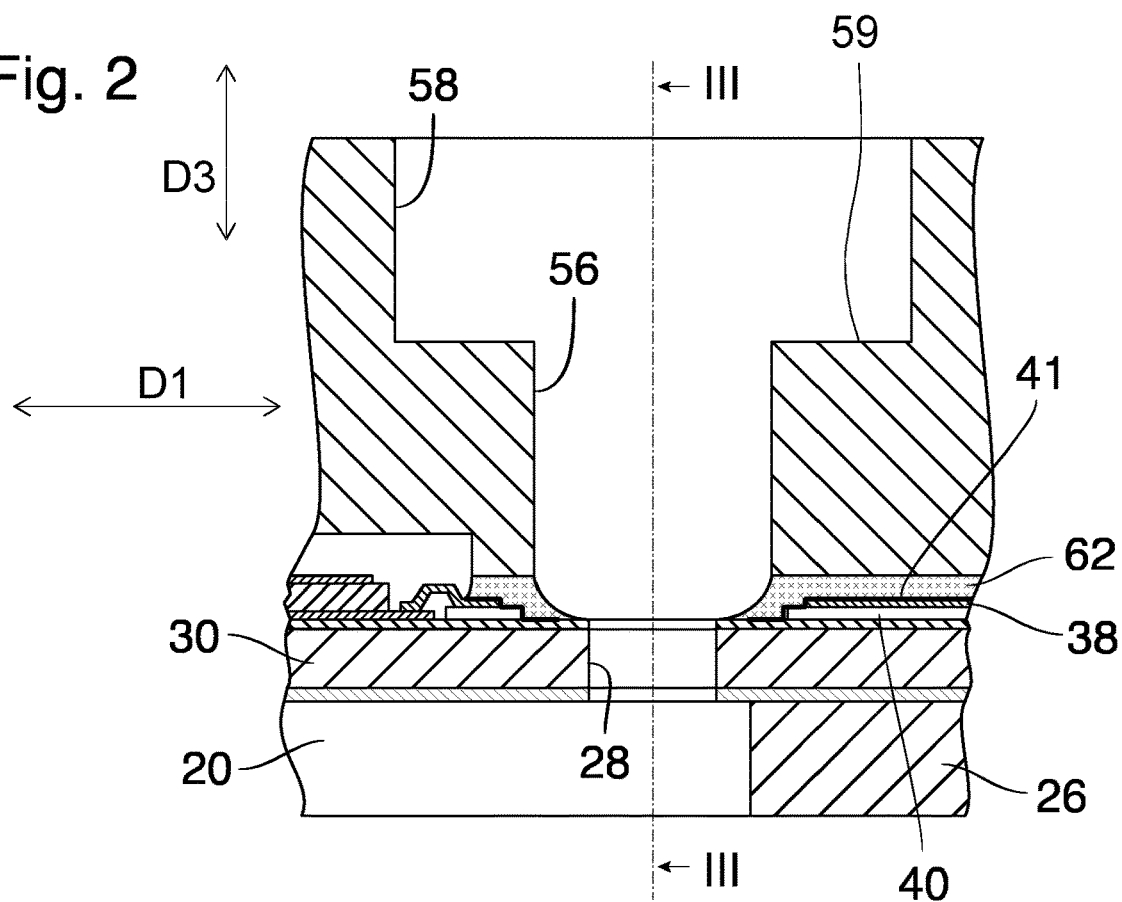
FIG. 2 is an enlarged sectional view of a portion of the device forming a restrictor passage and a membrane window.
Figure 3:
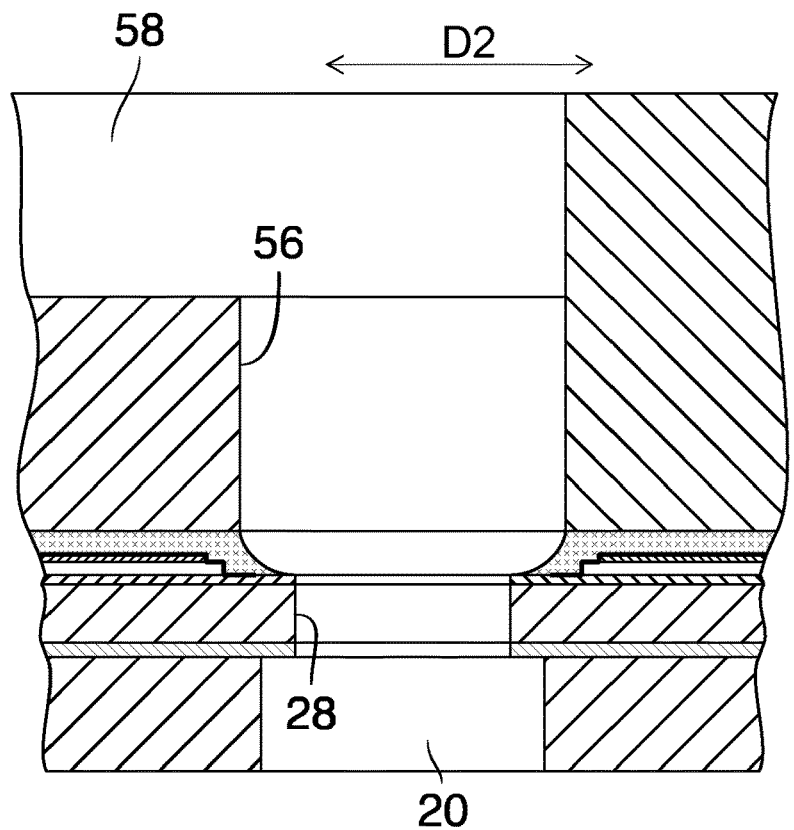
FIG. 3 is a sectional view taken along the line III-Ill in FIG. 2.

As has been shown in FIGS. 1 to 3, the distribution layer 12 is connected to the membrane layer 14 by a bonding layer 62. Similarly, the membrane layer 14 is connected to the nozzle layer 16 by a bonding layer 64 (FIG. 1). The bonding layers 62 and 64 being layers of an adhesive (e.g. BCB), their physical properties are difficult to control. However, in the design that has been proposed here, the bonding layers are arranged such that their properties do not significantly affect any of the critical parameters of the design.

As mentioned above, the distribution layer 12 may be 400 microns, while the membrane layer 14 and the nozzle layer 16 together may be only 200 microns thick. Hence, the mechanical strength and rigidity to enable to handle the fabricated wafer stack results from the thickness of the distribution layer 12. Note that the rigidity and mechanical strength are also needed for efficient droplet forming upon bending of the actuator 32. Without sufficient rigidity, the actuator 32 would bend not only the membrane 30, but potentially the whole stack would be deformed, resulting in a significant loss of bending energy and a corresponding deterioration of the actuation efficiency. Further, as the distribution layer provides for mechanical strength and rigidity, the membrane layer and the nozzle layer may have any desirable thickness, thereby providing more freedom of design, potentially resulting in a more efficient fluidic/acoustic design of the print head. Efficiency, in this case, may relate to energy efficiency or cost efficiency or efficiency of dimensions, or any other property that may be optimized.

Figure 4:
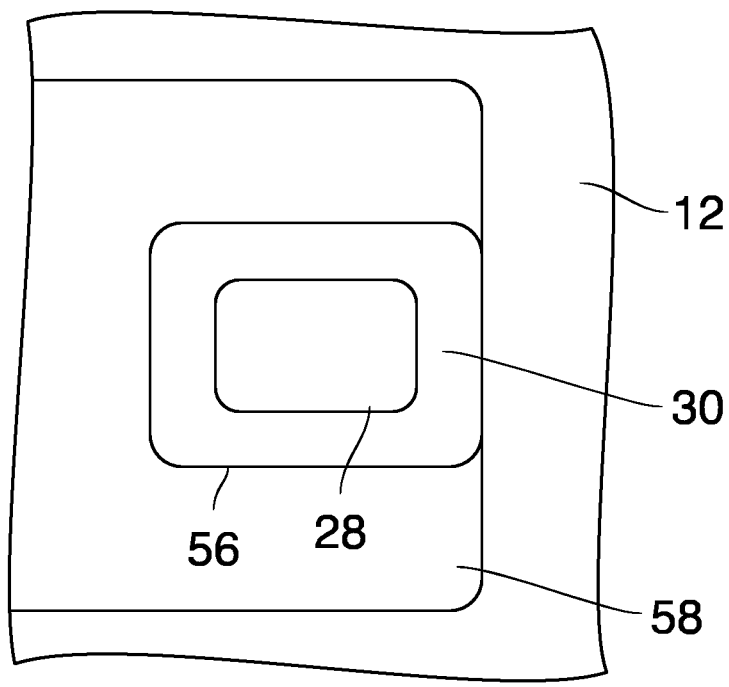
FIG. 4 shows the restrictor passage and the membrane window in a top plan view.

As is shown in FIGS. 2 to 4, the restrictor passage 56 and the window 28 have similar rectangular cross sections, with the width in the direction D1 in which the actuator and the pressure chamber extend (FIG. 2) being smaller than the width in the direction D2 perpendicular thereto (FIG. 3). In the top plan view in FIG. 4, the window 28 and parts of the membrane 30 surrounding the same are visible through the restrictor passage 56.

A process of manufacturing the device 10 will now be described in conjunction with FIGS. 5 to 8.

Figure 5:
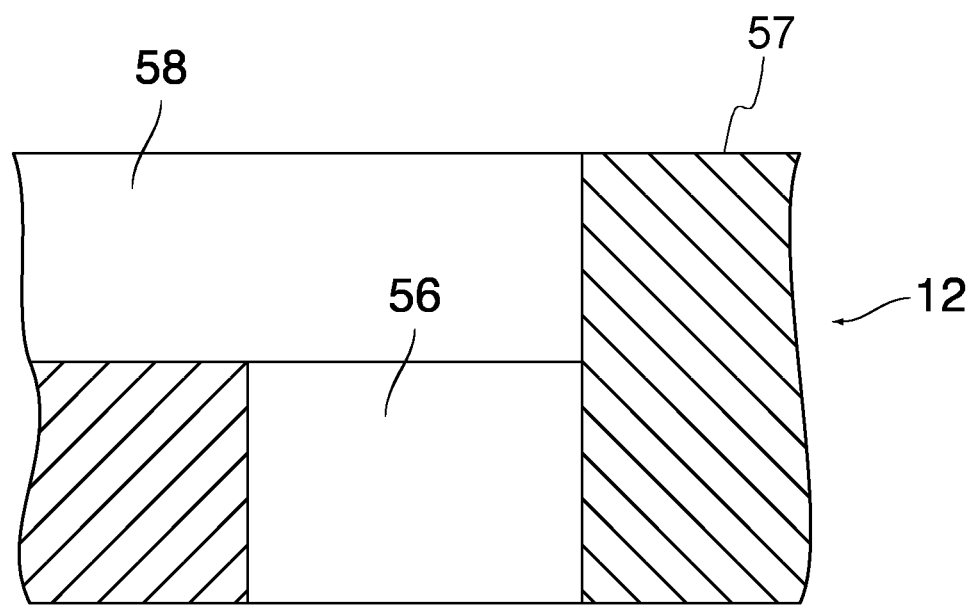
FIGS. 5 to 8 are sectional views illustrating steps of a manufacturing process for forming the droplet jetting device.

FIG. 5 shows a cross-section of a part the distribution layer 12, which may be formed by a DSP (Double Side Polished) silicon wafer with a total thickness of 400 micron (µm).

Using known photolithographic techniques of masking and etching, the trench 58 is formed in the top surface 57 of the distribution layer 12, and the restrictor passage 56 is formed within the area of the trench. An etch process such as DRIE (Deep Reactive Ion Etching) may be used for forming the restrictor passage 56.

Figure 6:
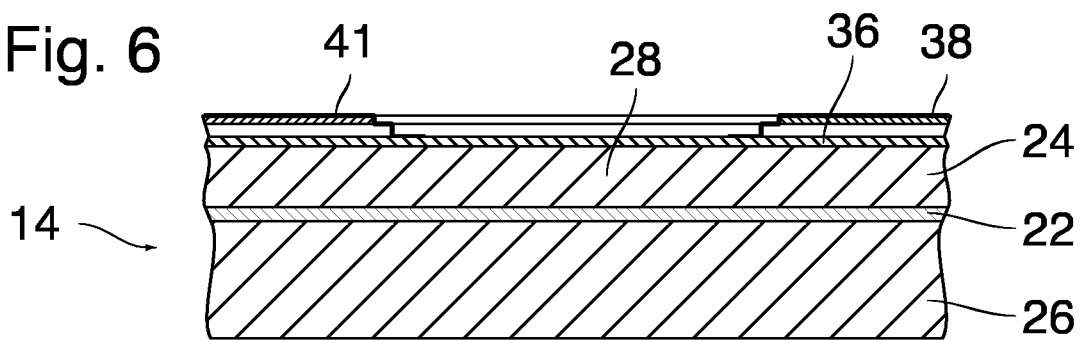
Figure 7:
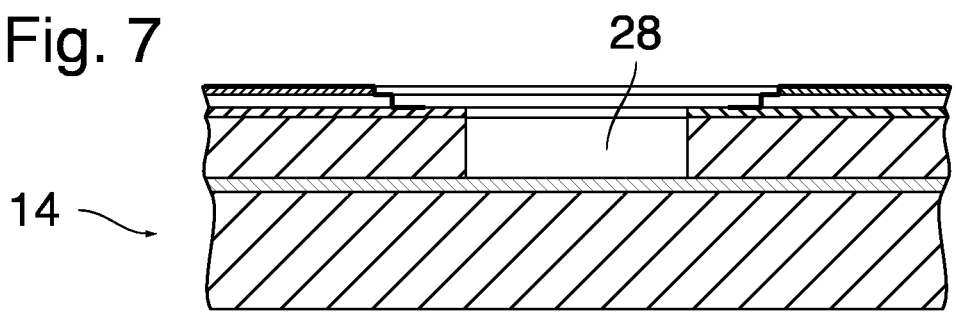

FIGS. 6 and 7 show steps of processing the membrane layer 14.

As is shown in FIG. 6, the process starts with providing an SOI wafer having the silicon layers 24 and 26 and the insulator layer 22 sandwiched therebetween. The oxide layer 36 has been formed on the top surface of the silicon layer 24. Then, the various layers of the actuators 32, the leads 38 and the protective layer 41 are built up step-wise on the top surface of the oxide layer 36.

FIG. 7 illustrates a step in which the window 28 has been formed in the membrane 30 by etching between the layer or layers forming the leads 38 and through the oxide layer 36 and at least the first layer of the SOI wafer. Again, a well-known and suitable etch process, such as DRIE for etching silicon, may by employed. The etch process may be continued into the bottom layer 26 of the SOI wafer where the pressure chamber 20 is to be formed in a later step, so that the depth of the etch process forming the openings 28 is not critical. In particular and as known by those skilled in the art, etching of $SiO_2$ is selective to Si etching, so no significant over-etching in silicon is to be expected.

Figure 8:
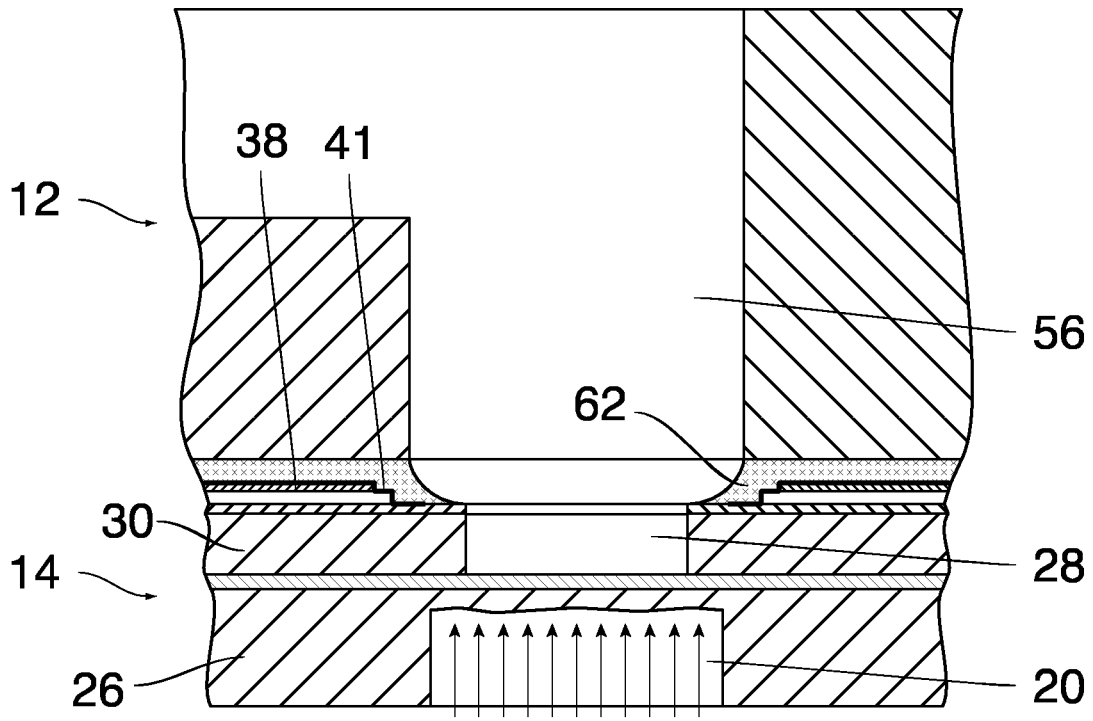

Then, the distribution layer 12 in the condition shown in FIG. 5 and the membrane layer 14 in the condition shown in FIG. 7 are bonded together in a first bonding step, as has been illustrated in FIG. 8. In this bonding step, the layers 12 and 14 are adjusted so as to align the restrictor passage 56 with the window 28.

When the adhesive in the bonding layer 62 has cured, the pressure chamber 20 is formed by DRIE etching into the silicon layer 26 from below (by applying a plasma etch process). The etching plasma jet has been symbolized by arrows in FIG. 8, showing a stage in which the etching process almost completed.

As soon as the barrier between the etch front and the window 28 has been removed, the etching plasma will enter into the restrictor passage 56 through the window 28. However, since the membrane window 28 is delimited by a contour that is inwardly offset from the contour of the restrictor passage 56 on the entire periphery of the restrictor passage 56, the cross section of the window 28 is narrower than that of the restrictor passage 56, and, in consequence, the edge of the bonding layer 62 surrounding the restrictor passage is shielded by the parts of the membrane 30 that surround the window 28. Thus, even when the adhesive has shrunk to some extent in the curing process, the ions from the etching plasma can hardly attack the adhesive and will therefore be kept away from the protective layer 41 on the leads 38 and from the leads itself. Consequently, when the jetting device will be put to use, the liquid ink will be kept away from the leads 38 and no leakage current will be produced.

The further steps for completing the jetting device may be the same as has been described in EP 3 362 289 B1 and have therefore not been illustrated here.

Figure 9:
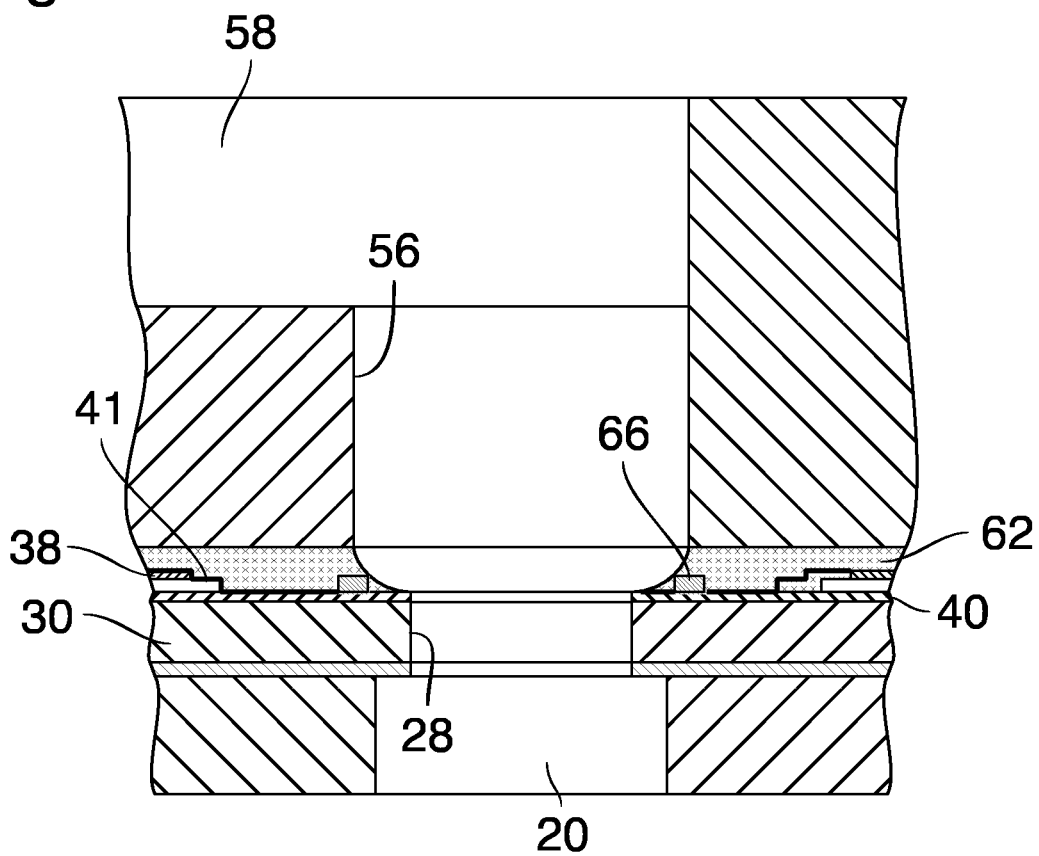
FIG. 9 is a sectional view of a device according to a modified embodiment.
Figure 10:
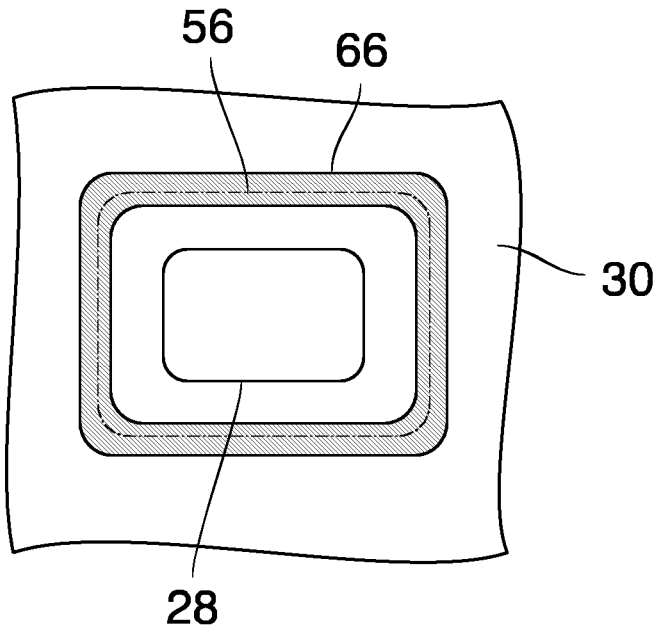
FIG. 10 is a top plan view of the restrictor passage and the membrane window in the embodiment shown in FIG. 9.

FIG. 9 is a sectional view analogous to FIG. 3 and illustrates a modified embodiment of a droplet jetting device. This embodiment is different from the one described before in that a metal lead 66 has been formed on the top side of the membrane 30 (on the primer layer 40) so as to surround the window 28 along the peripheral edge of the restrictor passage 56. FIG. 10 shows the lead 66 in a top plan view. The contour of the restrictor passage 56 has been indicated in phantom lines in FIG. 10.

The lead 66 may be formed from aluminium or an Al—Cu alloy and may optionally be grounded by being contacted by one of the leads 38 that serves as a ground lead. Alternatively, the lead 66 may be set at predetermined voltage by connecting it to a specific one of the leads 38. Applying a ground or predetermined voltage to the lead 66 may be used to direct the trajectory of ions during the etching process. The ions are then more prone to travel in the thickness direction D3 of the layer 14 as compared to directions D1, D2 parallel to the plane of the layer 14 in which directions D1, D2 ions travel towards the leads 38. Further, the lead 66 is embedded in the adhesive layer 62. If any clefts should have been formed in the adhesive layer, e.g. at the boundary between the adhesive layer and the primer layer 40 or the protective layer 41, and liquid should enter into these clefts, the liquid will only cause corrosion of the lead 66 and will thereby be prevented from proceeding further to the signal electrodes and power lines leading to the piezoelectric actuator. The material properties of the lead 66 may be applied to direct the corrosion to the lead 66, specifically its reactivity to the corrosive materials and/or its electrochemical properties. This effect may be enhanced by applying a suitable voltage to the lead 66, such as a ground voltage, to direct the corrosion, specifically the corrosive ions, towards the lead 66.

Although specific embodiments of the disclosure are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms "comprise", "comprising", "include", "including", "contain", "containing", "have", "having", and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms "a" and "an" used herein are intended to be understood as meaning one or more unless explicitly stated otherwise. Moreover, the terms "first", "second", "third", etc. are used merely as labels, and are not intended to impose numerical requirements on or to establish a certain ranking of importance of their objects.

The present disclosure being thus described, it will be obvious that the same may be varied in many ways. Such variations are not to be regarded as a departure from the spirit and scope of the present disclosure, and all such modifications as would be obvious to one skilled in the art are intended to be included within the scope of the following claims.

The invention claimed is:

1. A droplet jetting device comprising:
a membrane layer defining a pressure chamber that is in fluid communication with a nozzle, the membrane layer carrying, on a membrane that covers the pressure chamber, an actuator for generating pressure waves in a liquid in the pressure chamber;
a distribution layer bonded to the membrane layer on a side of the membrane and defining a supply line for supplying the liquid to the pressure chamber, the supply line being connected to the pressure chamber via a restrictor passage positioned over the pressure chamber and extending through the distribution layer in the thickness direction of that layer up to the membrane layer, and via a window formed in the membrane, wherein the restrictor passage has a uniform cross-section, and the membrane window is delimited by a contour that is inwardly offset from the contour of the restrictor passage on the entire periphery of the restrictor passage, wherein the ink supply line comprises a trench formed in the surface of the distribution layer, and the restrictor passage extends from the bottom of the trench.

2. The device according to claim 1, wherein the actuator is a piezoelectric actuator.

3. The device according to claim 1, wherein electrical leads that contact the actuator are embedded in a bonding layer by which the membrane layer is bonded to the distribution layer.

4. The device according to claim 1, wherein the membrane layer is made of an SOI wafer having silicon layers formed on opposite sides of an insulator layer, wherein one silicon layer constitutes the membrane and the other silicon layer defines the pressure chamber.

5. The device according to claim 1, wherein a metal lead is formed on the membrane in the form of a closed loop that surrounds the membrane window along the periphery of the restrictor passage.

6. The device according to claim 5, wherein the metal lead is grounded.

7. The device according to claim 1, wherein the restrictor passage is parallel to the thickness direction.

8. The device according to claim 7, wherein the restrictor passage extends from an end of the supply line up to the window.

9. An inkjet printer comprising a droplet jetting device comprising
a membrane layer defining a pressure chamber that is in fluid communication with a nozzle, the membrane layer carrying, on a membrane that covers the pressure chamber, an actuator for generating pressure waves in a liquid in the pressure chamber;
a distribution layer bonded to the membrane layer on the a side of the membrane and defining a supply line for supplying the liquid to the pressure chamber, the supply line being connected to the pressure chamber via a restrictor passage extending through the distribution layer in the thickness direction of that layer, and via a window formed in the membrane, wherein the restrictor passage has a uniform cross-section, and the membrane window is delimited by a contour that is inwardly offset from the contour of the restrictor passage on the entire periphery of the restrictor passage, wherein the ink supply line comprises a trench formed in the surface of the distribution layer, and the restrictor passage extends from the bottom of the trench.

\* \* \* \* \*